(12) United States Patent
Ha et al.

(10) Patent No.: US 12,340,845 B2
(45) Date of Patent: Jun. 24, 2025

(54) SPLIT BLOCK ARRAY FOR 3D NAND MEMORY

(71) Applicant: INTEL NDTM US LLC, Santa Clara, CA (US)

(72) Inventors: Chang Wan Ha, San Ramon, CA (US); Deepak Thimmegowda, Fremont, CA (US); Hoon Koh, San Jose, CA (US); Richard M. Gularte, Santa Clara, CA (US); Liu Liu, Dalian (CN); David Meyaard, Boise, ID (US); Ahsanur Rahman, Santa Clara, CA (US)

(73) Assignee: SK Hynix NAND Product Solutions Corp., Rancho Cordova, CA (US)

( * ) Notice: Subject to any disclaimer, the term of this patent is extended or adjusted under 35 U.S.C. 154(b) by 815 days.

(21) Appl. No.: 17/343,584

(22) Filed: Jun. 9, 2021

(65) Prior Publication Data
US 2022/0399057 A1 Dec. 15, 2022

(51) Int. Cl.
*G11C 16/04* (2006.01)
(52) U.S. Cl.
CPC .............................. *G11C 16/0483* (2013.01)
(58) Field of Classification Search
CPC .................................................. G11C 16/0483

USPC ....................................................... 365/185.17
See application file for complete search history.

(56) References Cited

U.S. PATENT DOCUMENTS

| 2014/0104948 A1* | 4/2014 | Rhie .................... G11C 11/4085 365/185.11 |
| 2020/0152650 A1* | 5/2020 | Thimmegowda ...... H10B 41/10 |
| 2021/0027841 A1* | 1/2021 | Park ........................ H01L 24/08 |

* cited by examiner

*Primary Examiner* — Alexander Sofocleous
*Assistant Examiner* — Tracy Hampton
(74) *Attorney, Agent, or Firm* — Morgan, Lewis & Bockius LLP

(57) ABSTRACT

An embodiment of a memory device may include a full block memory array of a lower tile of 3D NAND string memory cells, a full block memory array of an upper tile of 3D NAND string memory cells, a first portion of a string driver circuit coupled to the full block memory array of the lower tile, a second portion of the string driver circuit coupled to the full block memory array of the upper tile, a first split block memory array of the lower tile coupled to the first portion of the string driver circuit, and a second split block memory array of the upper tile coupled to the second portion of the string driver circuit. Other embodiments are disclosed and claimed.

12 Claims, 6 Drawing Sheets

SPLIT BLOCK ARRAY FOR 3D NAND MEMORY

BACKGROUND

A typical flash memory device may include a memory array that includes a large number of non-volatile memory cells arranged in row and column fashion. In recent years, vertical memory, such as three-dimensional (3D) memory, has been developed in various forms, such as NAND, or the like. A 3D flash memory array may include a plurality of memory cells stacked over one another to form a vertical NAND string. In a floating gate flash cell, a conductive floating gate may be positioned between a control gate and a channel of a transistor. The individual memory cells of the vertical NAND string may be on different layers arranged around a body that extends outward from a substrate, with the conductive floating gate (charge storage region) located on a similar or same plane as the control gate, extending outward horizontally from the body.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
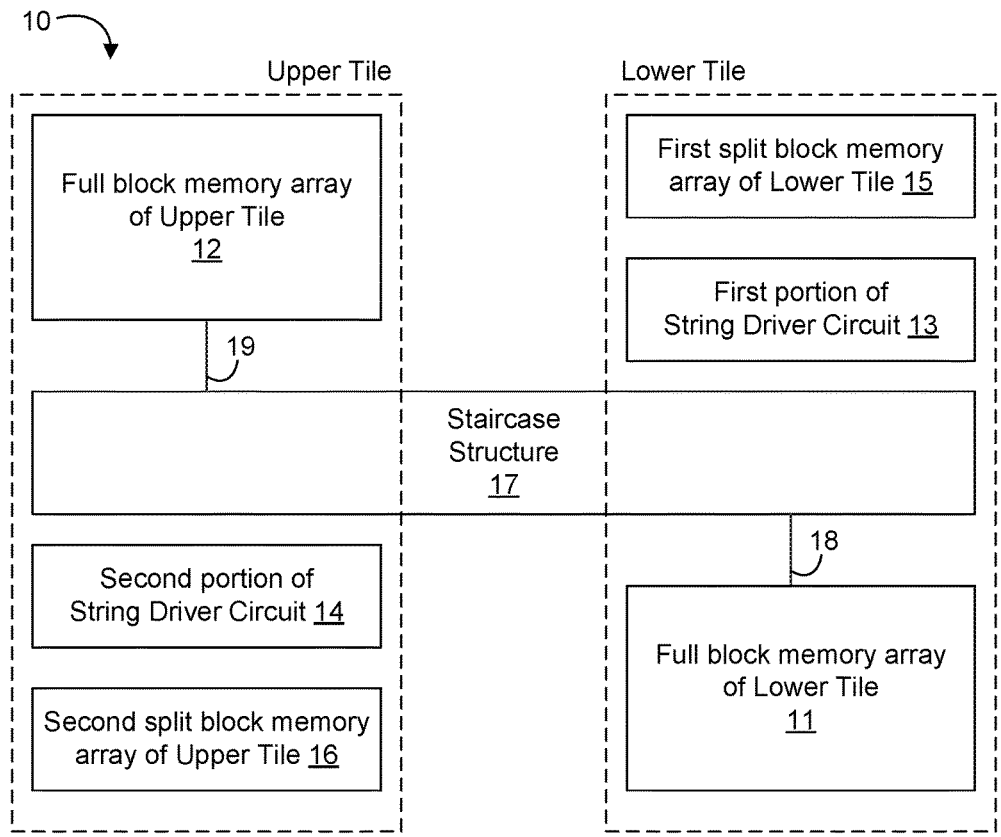
FIG. 1 is a block diagram of a memory device according to an embodiment.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, Field Programmable Gate Array (FPGA), firmware, driver, software, or any combination thereof. The material disclosed herein may also be implemented as instructions stored on a machine-readable medium, which may be read and executed by Moore Machine, Mealy Machine, and/or one or more processors. A machine-readable medium may include any medium and/or mechanism for storing or transmitting information in a form readable by a machine (e.g., a computing device). For example, a machine-readable medium may include read only memory (ROM); random access memory (RAM); Dynamic random-access memory (DRAM), magnetic disk storage media; optical storage media; NV memory devices; qubit solid-state quantum memory, electrical, optical, acoustical or other forms of propagated signals (e.g., carrier waves, infrared signals, digital signals, etc.), and others.

References in the specification to "one implementation", "an implementation", "an example implementation", etc., indicate that the implementation described may include a particular feature, structure, or characteristic, but every embodiment may not necessarily include the particular feature, structure, or characteristic. Moreover, such phrases are not necessarily referring to the same implementation. Further, when a particular feature, structure, or characteristic is described in connection with an embodiment, it is submitted that it is within the knowledge of one skilled in the art to effect such feature, structure, or characteristic in connection with other implementations whether or not explicitly described herein.

NV memory (NVM) may be a storage medium that does not require power to maintain the state of data stored by the medium. In one embodiment, the memory device may include a three-dimensional (3D) NAND device. The memory device may refer to the die itself and/or to a packaged memory product. In particular embodiments, a memory component with non-volatile memory may comply with one or more standards promulgated by the JEDEC, or other suitable standard (the JEDEC standards cited herein are available at jedec.org).

Some embodiments may advantageously provide technology for a half block (e.g., or split block) memory array for 3D NAND memory array. Some NAND memory devices may position the string driver in a circuit under array (CUA) area. Conventionally, the CUA does not include any memory cell array where a bit line exit is located and where a mirrored side of the bit line exit is located. Advantageously, some embodiments may utilize this otherwise wasted silicon area. Some embodiments may provide a higher density for a given die size (e.g., or a smaller die size for a given density, advantageously providing a higher terabyte (TB) outcome per wafer.

Some embodiments provide technology, circuitry, and/or manufacturing techniques to utilize the otherwise un-used area for additional memory cell area. In a typical density, for example, a number of blocks per plane may range from 128 blocks per plane to about 512 blocks per plane, depending on density, number of tiers in the 3D NAND technology, etc. In some embodiments, by changing the un-used silicon area into cell area, an additional four (4) blocks per plane may be provided without increasing die size.

With reference to FIG. 1, an embodiment of a memory device 10 may include, comprising a full block memory array of a lower tile 11 of 3D NAND string memory cells, a full block memory array of an upper tile 12 of 3D NAND string memory cells, a first portion 13 of a string driver circuit coupled to the full block memory array of the lower tile 11, a second portion 14 of the string driver circuit coupled to the full block memory array of the upper tile 12, a first split block memory array 15 of the lower tile coupled to the first portion 13 of the string driver circuit, and a second split block memory array 16 of the upper tile coupled to the second portion 14 of the string driver circuit. In some embodiments, the first split block memory array 15 and the second split block memory array 16 together provide a full block memory array. The memory device 10 may also include a staircase structure 17. For example, the full block memory array of the lower tile 11 and the full block memory array of the upper tile 12 are oppositely disposed with respect to the staircase structure 17, and the first split block memory array 15 and the second split block memory array 16 are oppositely disposed with respect to the staircase structure 17.

In some embodiments, the memory device 10 further includes a first bit line exit 18 for the full block memory array of the lower tile 11 disposed on a same side of the staircase structure 17 as the full block memory array of the lower tile 11, where the first bit line exit terminates at the staircase structure 17. The memory device 10 may also include a second bit line exit 19 for the full block memory array of the upper tile 12 disposed on a same side of the staircase structure 17 as the full block memory array of the upper tile 12, where the second bit line exit 19 terminates at the staircase structure 17. In some embodiments, the string driver circuit may be configured to select between a single full block access for the memory arrays of the lower and upper tiles 11, 12 and two split block accesses for memory arrays of the first and second split blocks 15, 16 based on a decoded memory address. For example, the 3D NAND string memory cells may comprise floating gate NAND memory cells, charge trap flash (CTF) NAND memory cells. etc.

Figure 2:
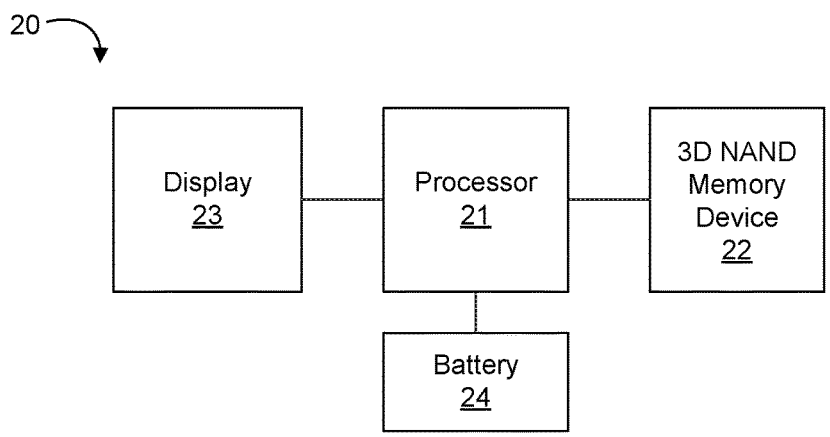
FIG. 2 is a block diagram of a system according to an embodiment.

With reference to FIG. 2, an embodiment of a system 20 may include a processor core 21 and a 3D NAND memory device 22 coupled to the processor core 21. For example, the 3D NAND memory device 22 may include one or more features or aspects of the embodiments described herein. In particular, the 3D NAND memory device 22 may include a full block memory array of a lower tile of 3D NAND string memory cells, a full block memory array of an upper tile of 3D NAND string memory cells, a first portion of a string driver circuit coupled to the full block memory array of the lower tile, a second portion of the string driver circuit coupled to the full block memory array of the upper tile, a first split block memory array of the lower tile coupled to the first portion of the string driver circuit, and a second split block memory array of the upper tile coupled to the second portion of the string driver circuit. In some embodiments, the first split block memory array and the second split block memory array together provide a full block memory array. The 3D NAND memory device 22 may also include a staircase structure. For example, the full block memory array of the lower tile and the full block memory array of the upper tile are oppositely disposed with respect to the staircase structure, and the first split block memory array and the second split block memory array are oppositely disposed with respect to the staircase structure.

In some embodiments, the 3D NAND memory device 22 further includes a first bit line exit for the full block memory array of the lower tile disposed on a same side of the staircase structure as the full block memory array of the lower tile, where the first bit line exit terminates at the staircase structure. The 3D NAND memory device 22 may also include a second bit line exit for the full block memory array of the upper tile disposed on a same side of the staircase structure as the full block memory array of the upper tile, where the second bit line exit terminates at the staircase structure. In some embodiments, the string driver circuit may be configured to select between a single full block access for the memory arrays of the lower and upper tiles and two split block accesses for memory arrays of the first and second split blocks based on a decoded memory address. For example, the 3D NAND string memory cells may comprise floating gate NAND memory cells, CTF NAND memory cells. etc. In some embodiments, the system 20 may comprise a mobile computing device and may include any of a number of connected devices, peripherals, and/or components, such as at least one of a display 23 communicatively coupled to the processor 21, or a battery 24 coupled to the processor 21, etc.

Figure 3A:
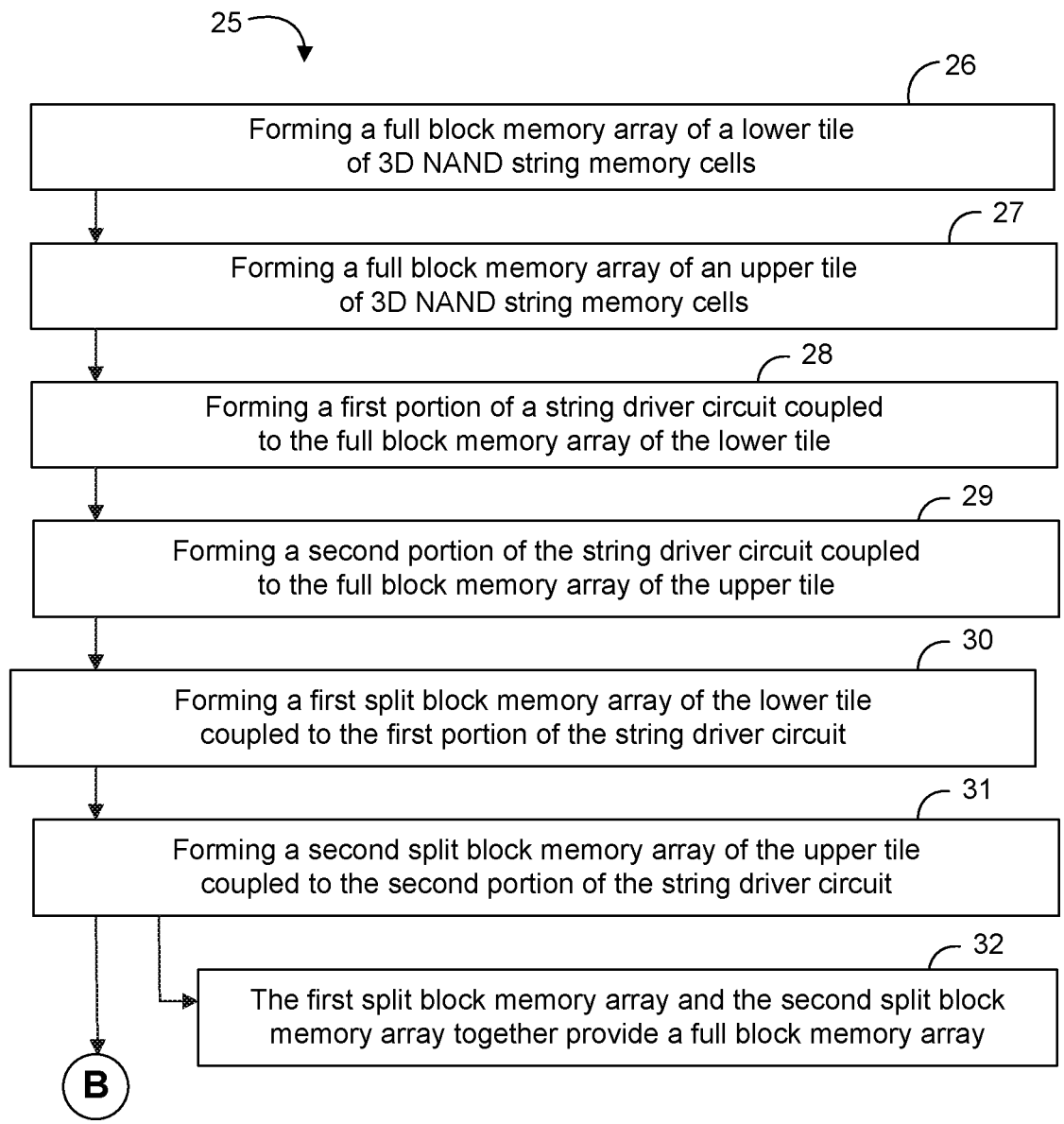
FIGS. 3A to 3B is a flowchart of an example of a method to manufacture a memory device according to an embodiment.
Figure 3B:
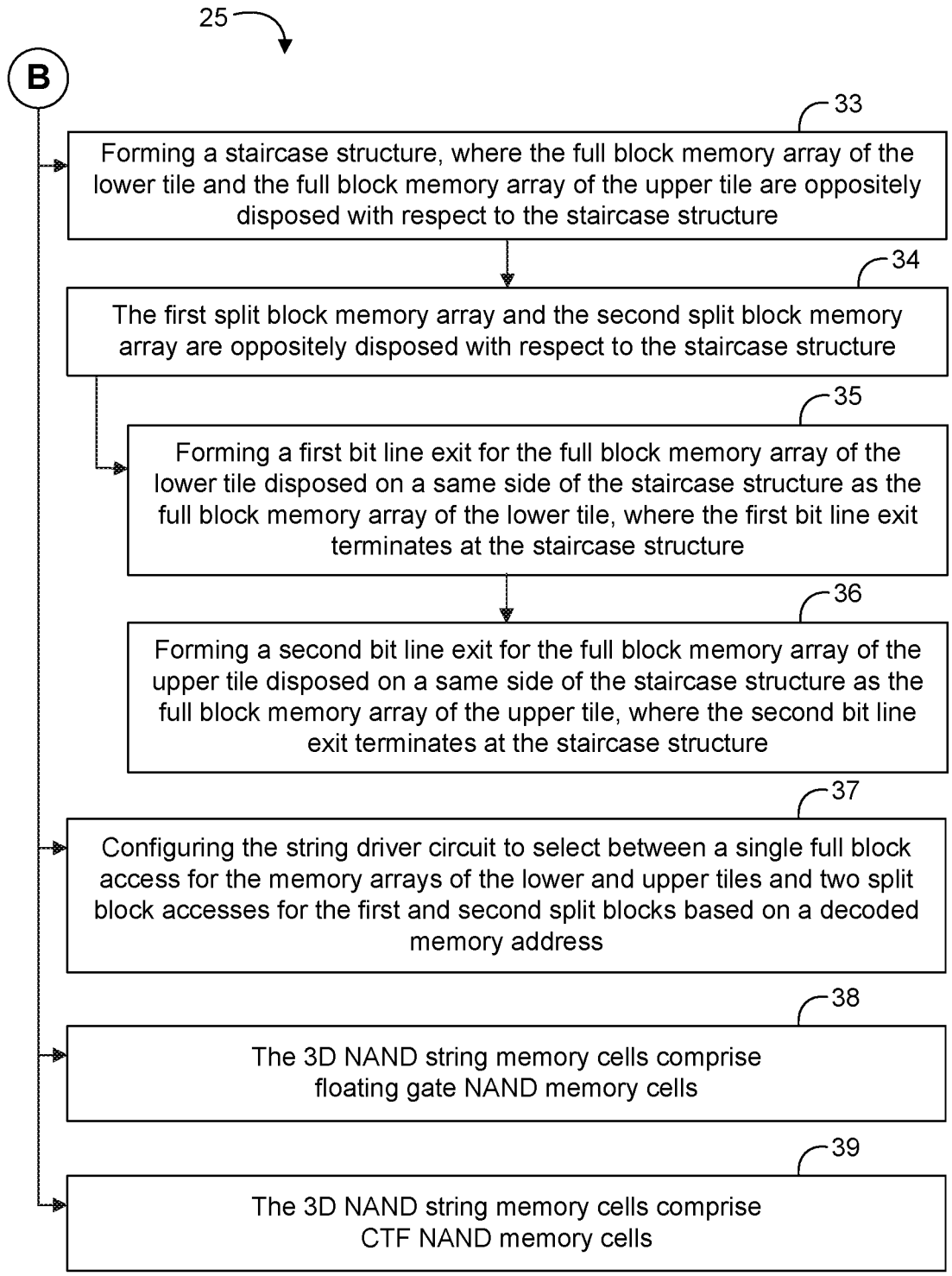

With reference to FIGS. 3A to 3B, an embodiment of a method 25 to manufacture a memory device may include forming a full block memory array of a lower tile of 3D NAND string memory cells at box 26, forming a full block memory array of an upper tile of 3D NAND string memory cells at box 27, forming a first portion of a string driver circuit coupled to the full block memory array of the lower tile at box 28, forming a second portion of the string driver circuit coupled to the full block memory array of the upper tile at box 29, forming a first split block memory array of the lower tile coupled to the first portion of the string driver circuit at box 30, and forming a second split block memory array of the upper tile coupled to the second portion of the string driver circuit at box 31. In some embodiments, the first split block memory array and the second split block memory array together provide a full block memory array at box 32.

Some embodiments of the method 25 may further include forming a staircase structure, where the full block memory array of the lower tile and the full block memory array of the upper tile are oppositely disposed with respect to the staircase structure at box 33, and where the first split block memory array and the second split block memory array are oppositely disposed with respect to the staircase structure at box 34. The method 25 may also include forming a first bit line exit for the full block memory array of the lower tile disposed on a same side of the staircase structure as the full block memory array of the lower tile, where the first bit line exit terminates at the staircase structure at box 35, and forming a second bit line exit for the full block memory array of the upper tile disposed on a same side of the staircase structure as the full block memory array of the upper tile, where the second bit line exit terminates at the staircase structure at box 36. Some embodiments of the method 25 may further include configuring the string driver circuit to select between a single full block access for the memory arrays of the lower and upper tiles and two split block accesses for the first and second split blocks based on a decoded memory address at box 37. For example, the 3D NAND string memory cells comprise floating gate NAND memory cells at box 38, CTF NAND memory cells at box 39, etc.

Figure 4:
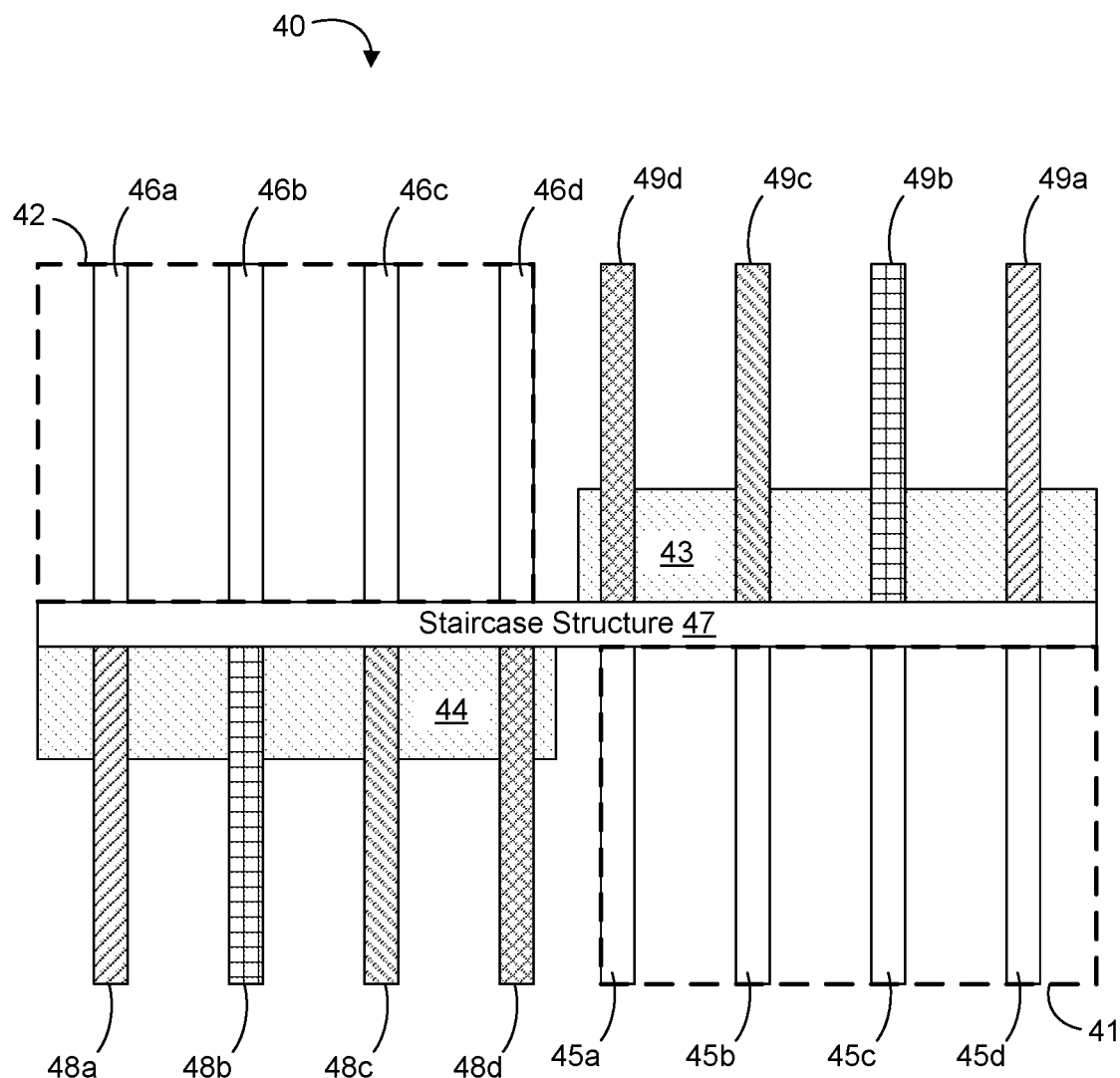
FIG. 4 is a block diagram of an example of a three-dimensional (3D) NAND memory device according to an embodiment.

With reference to FIG. 4, an embodiment of a 3D NAND memory device 40 includes a 3D NAND vertical arrays 41 and 42 and string driver circuit portions 43 and 44 in a CUA area (e.g., shown in a partial planar view). For example, the array 41 of memory blocks may correspond to a lower tile group and the array 42 may correspond to an upper tile group. The device 40 may further include a first set of bit line exits 45a-d (collectively bit lines 45) in the area of the array 41 of the lower tile, and a second set of bit line exits 46a-d (collectively bit lines 46) in the area of the array 42. The two arrays 41 and 42 may be on opposite sides of a staircase structure 47. Conventionally, the bit line exits may extend on both sides of the staircase structure and the silicon area aligned with the bit line exits on the side of the staircase structure 47 opposite to the arrays 41 and 42 may be un-used. As shown in FIG. 4, embodiments of the memory device 40 may terminate the bit lines 45 and 46 on the same side of the staircase structure 47 as their respective arrays 41 and 42 and provide four additional first half block memory arrays 48a-d and four additional second half block memory arrays 49a-d in the otherwise unused silicon area. In operation, the first and second half block memory arrays operate in pairs to provide four additional full block memory arrays (e.g., where matching cross hatch patterns indicate matching pairs).

Figure 5:
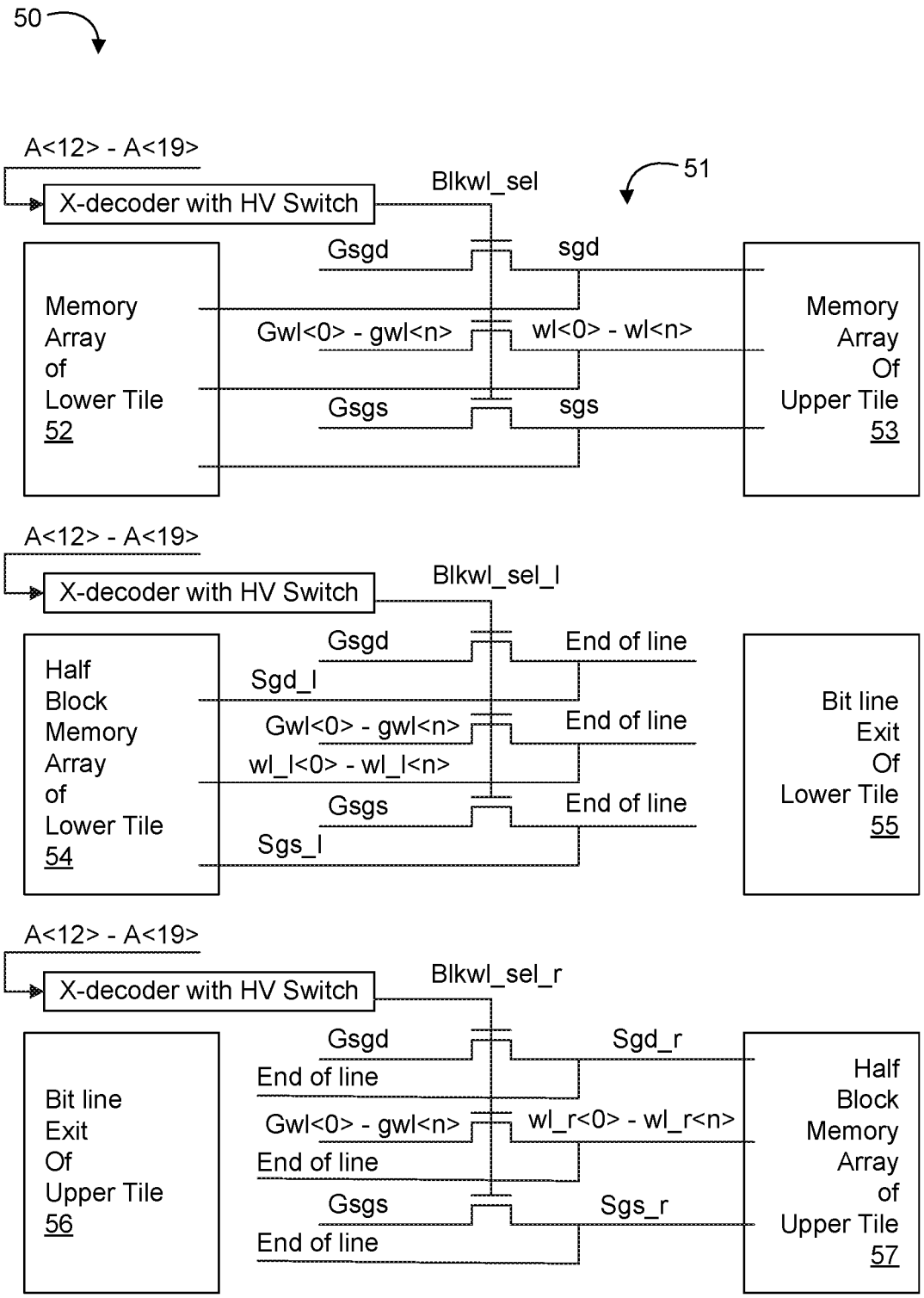
FIG. 5 is a block diagram of another example of a 3D NAND memory device according to an embodiment.

With reference to FIG. 5, an embodiment of 3D NAND memory device 50 includes an array word line driver 51 to access to the memory array tile groups. The memory device 50 include a memory array of a lower tile 52, a memory array of an upper tile 53, a first half block memory array of the lower tile 54, a bit line exit of the lower tile 55, a bit line exit of the upper tile 56, and a second half block memory array of the upper tile 57. As illustrated, the stack of blocks 52 to 57 also conceptually correspond to the vertical stack of circuitry in the 3D NAND memory device 50. Conventionally, the blocks 54 and 57 would correspond to unused silicon area (e.g., there would be no memory cells in this area). Advantageously, embodiments of the 3D NAND memory device 50 include the first half block memory array of the lower tile 54 and the second half block memory array of the upper tile 57 in the otherwise unused silicon area to increase the density of the memory array (e.g., for a given die size).

The array word line drive 51 may provide respective block word line select signals, Blkwl_sel, Blkwl_sel_l, and Blkwl_sel_r, to selectively access the memory arrays of the lower tile 52 and upper tile 53 or the first and second half block memory arrays of the lower tile 54 and upper tile 57. For normal block access, the signals may be set as Blkwl_sel=high and Blkwl_sel_l=Blkwl_sel_r=low. For access to the first and second half blocks, the signals may be set as Blkwl_sel=low and Blkwl_sel_l=Blkwl_sel_r=high.

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

Figure 6:
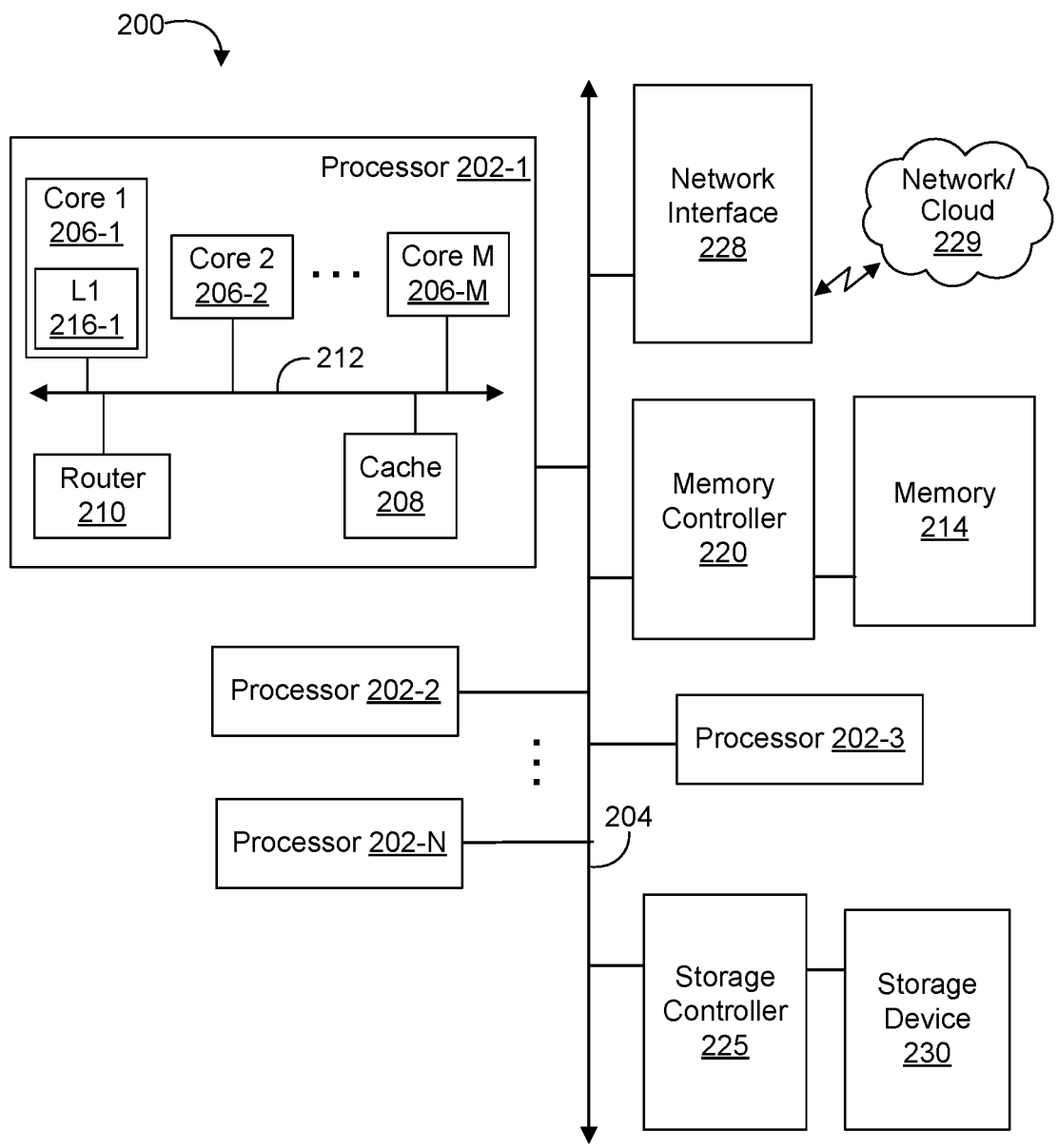
FIG. 6 is a block diagram of an example of a computing system according to an embodiment.

Turning now to FIG. 6, an embodiment of a computing system 200 may include one or more processors 202-1 through 202-N (generally referred to herein as "processors 202" or "processor 202"). The processors 202 may communicate via an interconnection or bus 204. Each processor 202 may include various components some of which are only discussed with reference to processor 202-1 for clarity. Accordingly, each of the remaining processors 202-2 through 202-N may include the same or similar components discussed with reference to the processor 202-1.

In some embodiments, the processor 202-1 may include one or more processor cores 206-1 through 206-M (referred to herein as "cores 206," or more generally as "core 206"), a cache 208 (which may be a shared cache or a private cache in various embodiments), and/or a router 210. The processor cores 206 may be implemented on a single integrated circuit (IC) chip. Moreover, the chip may include one or more shared and/or private caches (such as cache 208), buses or interconnections (such as a bus or interconnection 212), circuitry 270, memory controllers, or other components.

In some embodiments, the router 210 may be used to communicate between various components of the processor 202-1 and/or system 200. Moreover, the processor 202-1 may include more than one router 210. Furthermore, the multitude of routers 210 may be in communication to enable data routing between various components inside or outside of the processor 202-1.

The cache 208 may store data (e.g., including instructions) that is utilized by one or more components of the processor 202-1, such as the cores 206. For example, the cache 208 may locally cache data stored in a memory 214 for faster access by the components of the processor 202. As shown in FIG. 6, the memory 214 may be in communication with the processors 202 via the interconnection 204. In some embodiments, the cache 208 (that may be shared) may have various levels, for example, the cache 208 may be a mid-level cache and/or a last-level cache (LLC). Also, each of the cores 206 may include a level 1 (L1) cache (216-1) (generally referred to herein as "L1 cache 216"). Various components of the processor 202-1 may communicate with the cache 208 directly, through a bus (e.g., the bus 212), and/or a memory controller or hub.

As shown in FIG. 6, memory 214 may be coupled to other components of system 200 through a memory controller 220. Memory 214 may include volatile memory and may be interchangeably referred to as main memory or system memory. Even though the memory controller 220 is shown to be coupled between the interconnection 204 and the memory 214, the memory controller 220 may be located elsewhere in system 200. For example, memory controller 220 or portions of it may be provided within one of the processors 202 in some embodiments. Alternatively, memory 214 may include byte-addressable non-volatile memory such as INTEL OPTANE technology.

The system 200 may communicate with other devices/systems/networks via a network interface 228 (e.g., which is in communication with a computer network and/or the cloud 229 via a wired or wireless interface). For example, the network interface 228 may include an antenna (not shown) to wirelessly (e.g., via an Institute of Electrical and Electronics Engineers (IEEE) 802.11 interface (including IEEE 802.11a/b/g/n/ac, etc.), cellular interface, 3G, 4G, LTE, BLUETOOTH, etc.) communicate with the network/cloud 229.

System 200 may also include a storage device such as a storage device 230 coupled to the interconnect 204 via storage controller 225. Hence, storage controller 225 may control access by various components of system 200 to the storage device 230. Furthermore, even though storage controller 225 is shown to be directly coupled to the interconnection 204 in FIG. 6, storage controller 225 can alternatively communicate via a storage bus/interconnect (such as the SATA (Serial Advanced Technology Attachment) bus, Peripheral Component Interconnect (PCI) (or PCI EXPRESS (PCIe) interface), NVM EXPRESS (NVMe), Serial Attached SCSI (SAS), Fiber Channel, etc.) with one or more other components of system 200 (for example where the storage bus is coupled to interconnect 204 via some other logic like a bus bridge, chipset, etc.) Additionally, storage controller 225 may be incorporated into memory controller logic or provided on a same integrated circuit (IC) device in various embodiments (e.g., on the same circuit board device as the storage device 230 or in the same enclosure as the storage device 230).

Furthermore, storage controller 225 and/or storage device 230 may be coupled to one or more sensors (not shown) to receive information (e.g., in the form of one or more bits or signals) to indicate the status of or values detected by the one or more sensors. These sensor(s) may be provided proximate to components of system 200 (or other computing systems discussed herein), including the cores 206, interconnections 204 or 212, components outside of the processor 202, storage device 230, SSD bus, SATA bus, storage controller 225, etc., to sense variations in various factors affecting power/thermal behavior of the system/platform, such as temperature, operating frequency, operating voltage, power consumption, and/or inter-core communication activity, etc.

Any of the memory and/or storage devices in the system 200 may include one or more features or aspects of embodiments of the 3D NAND memory described herein.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as bit stream multiplexer or de-multiplexer modules and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more graphics processing unit(s) or processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement at least portions of the operations discussed herein and/or any portions the devices, systems, or any module or component as discussed herein.

As used in any implementation described herein, the term "module" refers to any combination of software logic, firmware logic, hardware logic, and/or circuitry configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, fixed function circuitry, execution unit circuitry, and/or firmware that stores instructions executed by programmable circuitry. The modules may, collectively or individually, be embodied as circuitry that forms part of a larger system, for example, an integrated circuit (IC), system on-chip (SoC), and so forth.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as IP cores may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. A memory device, comprising:
 a full block memory array of each of a lower tile and an upper tile of 3D NAND string memory cells, wherein:
  along a first lateral length of a staircase structure passing through the lower tile and the upper tile, the full block memory array comprises a first plurality of bit line exits where there are no memory cells, the first plurality of bit line exits extending a second lateral length, orthogonal to the first lateral length, from a first side of the full block memory array, and terminating at the staircase structure; and
  along a second lateral length of the staircase structure, the full block memory array comprises a second plurality of bit line exits where there are no memory cells, the second plurality of bit line exits extending a third lateral length, orthogonal to the first lateral length, from a second, opposite, side of the full block memory array, and terminating at the staircase structure;
 a split block memory array of each of the lower tile and the upper tile of the 3D NAND string memory cells, wherein:
  along the first lateral length of the staircase structure, the split block memory array comprises a first plurality of split blocks of memory cells colinear with corresponding ones of the first plurality of bit line exits, the first plurality of split blocks extending the third lateral length from the second, opposite, side of the full block memory array, and terminating at the staircase structure; and
  along the second lateral length of the staircase structure, the split block memory array comprises a second plurality of split blocks of memory cells colinear with corresponding ones of the second plurality of bit line exits, the second plurality of split blocks extending the second lateral length from the first side of the full block memory array, and terminating at the staircase structure;
 a first portion of a string driver circuit coupled to the full block memory array and to the split block memory array of the lower tile; and a second portion of the string driver circuit coupled to the full block memory array and to the split block memory array of the upper tile.

2. The memory device of claim 1, wherein the split block memory array of the lower tile and the split block memory array of the upper tile together sum to the full block memory array.

3. The memory device of claim 1,
wherein:
each of the first plurality of bit line exits separate adjacent memory cells by a first portion of the first lateral length of the staircase structure;
each of the second plurality of bit line exits separate adjacent memory cells by a first portion of the second lateral length of the staircase structure;
the first plurality of split blocks of memory cells occupy the first portions of the first lateral length of the staircase structure; and
each of the second plurality of split blocks of memory cells occupy the first portions of the second lateral length of the staircase structure.

4. The memory device of claim 1, wherein:
the first plurality of bit line exits consists of an integer number n bit line exits;
the second plurality of bit line exits consists of n bit line exits;
the first plurality of split blocks consists of n split blocks;
the second plurality of split blocks consists of n split blocks; and
the first plurality of split blocks and second plurality of split blocks are configured to operate in pairs to provide n full block arrays.

5. The memory device of claim 1, wherein the string driver circuit is configured to:
select between (1) a single full block access for the split block memory array of the lower tile and the split block memory array of the upper tile and (2) a pair of split block accesses for a single one of the first plurality of split blocks and the second plurality of split blocks based on a decoded memory address.

6. The memory device of claim 1, wherein a first of the first plurality of split blocks nearest to a first of first plurality of bit line exits is to operate in a pair with a first of the second plurality of split blocks nearest to a first of the second plurality of bit line exits, and wherein a second of the first plurality of split blocks farthest from the first of first plurality of bit line exits is to operate in a pair with a second of the second plurality of split blocks farthest from the first of the second plurality of bit line exits.

7. The memory device of claim 1, wherein the 3D NAND string memory cells comprise floating gate or charge trap flash NAND memory cells.

8. A system, comprising:
 a processor core; and
 the memory device of claim 1 coupled to the processor core.

9. The system of claim 8, wherein the system comprises a mobile computing device and further includes at least one of:
 a display communicatively coupled to the processor core; or
 a battery coupled to the processor core.

10. An integrated circuit (IC) die, comprising:
 a stack of memory array tiles; and
 a staircase structure through the stack and extending in a first direction, wherein each of the memory array tiles comprises:

first n bit line exits spaced apart over a first half-length of the staircase structure, wherein there are no memory cells within a first plurality of bit line exits, and wherein each of the first plurality of bit line exits extends in a second direction orthogonal to the first direction, from a first side of the memory array tiles and terminating at the staircase structure; and second n bit line exits spaced apart over a second half-length of the staircase structure, wherein there are no memory cells within a second plurality of bit line exits, and wherein each of the second plurality of bit line exits extends in the second direction from a second, opposite, side of the memory array tiles and terminating at the staircase structure;

first n split blocks of memory cells colinear with corresponding ones of the first n bit line exits, wherein the first n split blocks extend in the second direction from the second, opposite, side of the memory array tiles, and terminate at the staircase structure; and second n split blocks of memory cells colinear with corresponding ones of the second n bit line exits, wherein the second n split blocks extend in the second direction from the first side of the memory array tiles, and terminate at the staircase structure; and a string driver circuit coupled to the memory array tiles.

11. The IC die of claim 10, wherein the string driver circuit is to concurrently select a pair of first and second n split blocks of memory cells.

12. The IC die of claim 11, wherein the string driver circuit is to select a first of the first n split blocks nearest to a first of first n bit line exits concurrently with a first of the second n split blocks nearest to a first of the second n bit line exits, and wherein a second of the first n split blocks farthest from the first of first n bit line exits is to operate in a pair with a second of the second n split blocks farthest from first of the second n bit line exits.

* * * * *